United States Patent [19]

Elworthy

[11] Patent Number: 5,012,345
[45] Date of Patent: Apr. 30, 1991

[54] FILM REGISTRATION APPARATUS AND METHOD

[75] Inventor: Trevor P. Elworthy, Buckinghamshire, England

[73] Assignee: Protocol Engineering PLC, Hertfordshire, England

[21] Appl. No.: 563,739

[22] Filed: Jul. 31, 1990

Related U.S. Application Data

[63] Continuation of Ser. No. 300,524, Jan. 23, 1989, abandoned.

[30] Foreign Application Priority Data

Jan. 26, 1988 [GB] United Kingdom .................. 8801691

[51] Int. Cl.$^5$ .............................................. H04N 3/36
[52] U.S. Cl. ........................................ 358/214; 358/54
[58] Field of Search ............................... 358/214–216, 358/54

[56] References Cited

U.S. PATENT DOCUMENTS

| 428,971 | 6/1843 | France | 358/215 |
|---|---|---|---|
| 3,585,292 | 6/1971 | Crowder | 358/214 |
| 3,588,347 | 6/1971 | Montone et al. | 358/113 |
| 3,627,918 | 12/1971 | Redpath | 358/88 |
| 3,627,922 | 12/1971 | Goldmark | 358/214 |
| 3,903,363 | 9/1975 | Montone et al. | 358/101 |
| 4,054,918 | 10/1977 | Kamogawa et al. | 358/214 |
| 4,258,388 | 3/1981 | Weisman et al. | 358/100 |
| 4,418,360 | 11/1983 | Glasgow | 358/214 |
| 4,568,971 | 2/1986 | Alzmann et al. | 358/101 |
| 4,603,966 | 8/1986 | Brownstein | 358/54 |
| 4,653,369 | 3/1987 | Dunsirn | 83/411 R |
| 4,667,245 | 5/1987 | Matsumoto et al. | 358/215 |

FOREIGN PATENT DOCUMENTS

| 0055939 | 7/1982 | European Pat. Off. . |
| 0204901 | 12/1986 | European Pat. Off. . |
| 2059627 | 4/1981 | United Kingdom . |

Primary Examiner—Stephen Brinich
Attorney, Agent, or Firm—Panitch Schwarze Jacobs & Nadel

[57] ABSTRACT

Apparatus and method for punching registration holes in exposed films having cooperating image areas, in which the films to be registered and punched are supported on a platform, punch means is mounted on the platform for punching registration holes in each film outside its image area, and electronic means is provided for producing an image, preferably, magnified, of at least one selected part of a film supported on the platform.

30 Claims, 4 Drawing Sheets

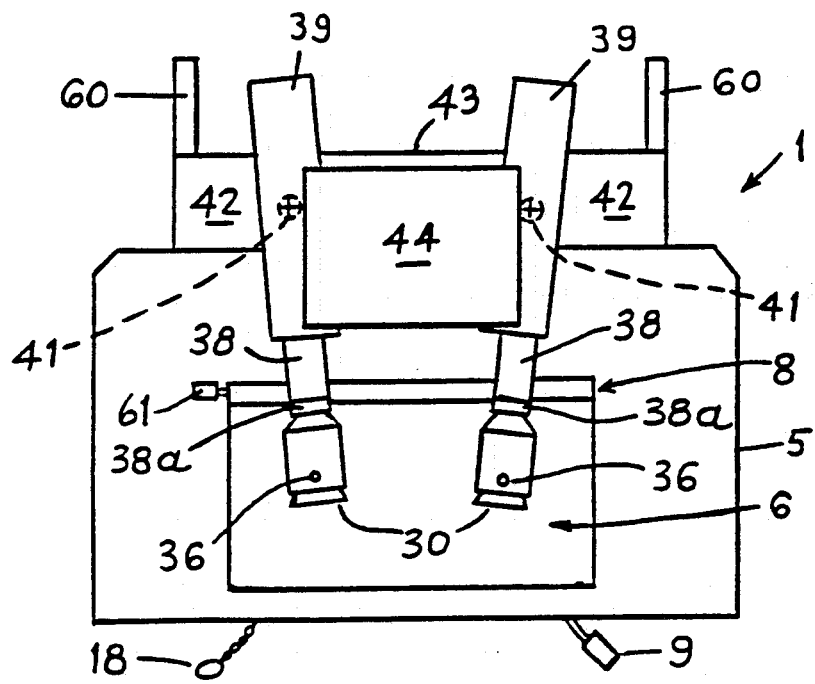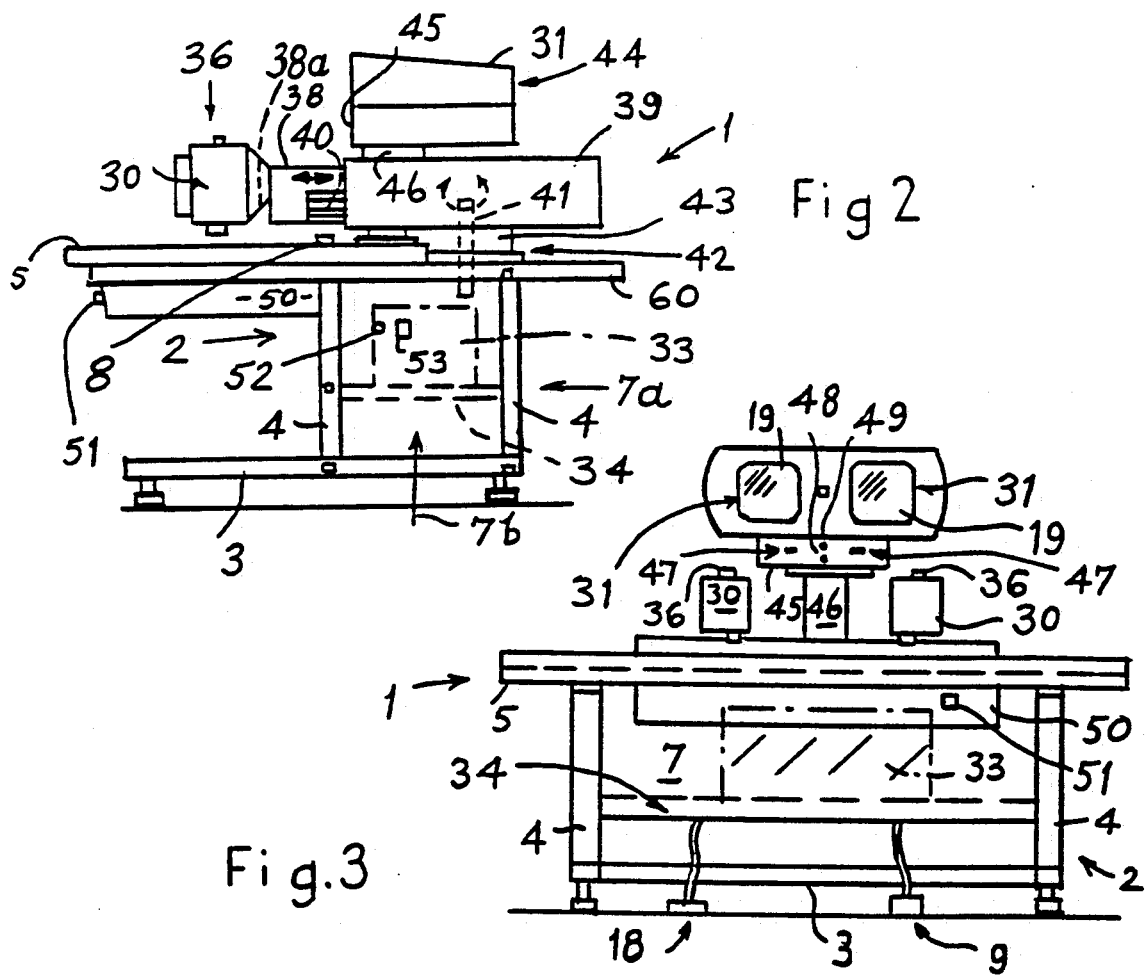

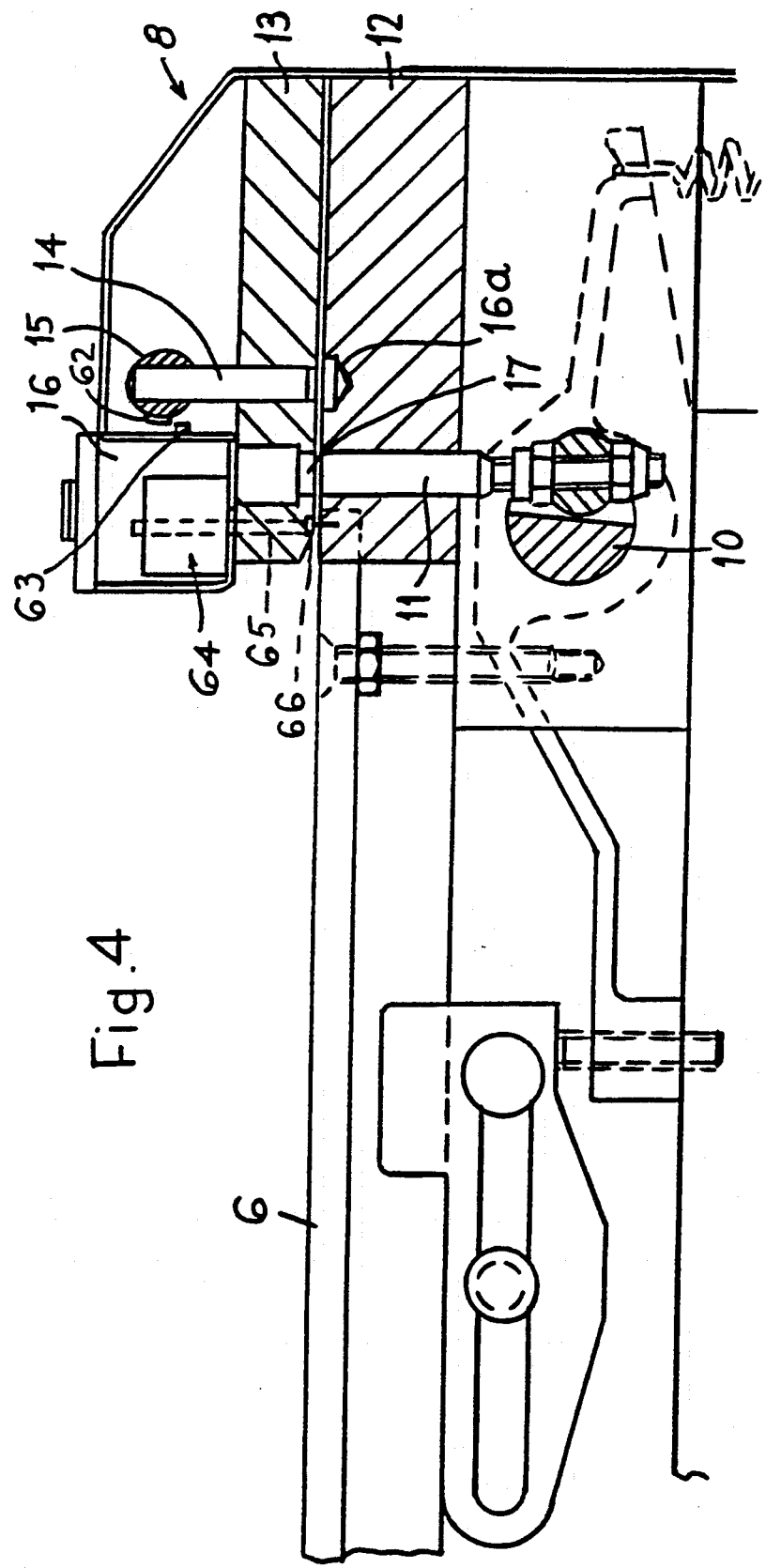

FILM REGISTRATION APPARATUS AND METHOD

This is a continuation of application Ser. No. 300,524, filed 1/23/89, and now abandoned.

BACKGROUND OF THE INVENTION

This invention relates to film punches, e.g. for providing multiple films such as colour separations with punch register after exposure, and particularly for registering multi-colour half-tone separations produced on an electronic film scanner or process camera.

One type of film punch manufactured by the applicants, has an illuminated platform capable of accepting a maximum film size of 60×50 cm and punching heads which are inverted for operation from below upwards. A key film, usually that representing the blue separation or that with the most detail, is selected and placed on the platform over the punching heads, which are operated to perforate the film. The punching heads are brought to a position in which the punches project into, and are retained within the thickness of the key film to provide a positive location. Then the next separation is placed over the key film, slid over the punching heads, registered visually to the key film and the punching heads are operated to perforate the second film. The second separation is removed and the same procedure is repeated for the remaining colour separations, after which the key film is released by depressing the punching heads to their original position.

Early electronic scanners were mostly single-channel and produced colour separations one colour at a time, so that colour sets could be produced in register much the same as on a camera, by fitting the film drum with register pins. This enabled four separate pieces of film to be punched and placed in turn on the pins on the drum.

However, in the multi-channel scanners now in operation such as a four-channel scanner, the original film transparency is fitted to one drum and the fourcolour separations are produced on a single piece of film. One multi-channel scanner can produce register markings on the film that are in register with each separation. Furthermore, if register markings are included with the original transparency, for example by adhering register crosses thereto, then after the scanning operation they will appear against each separation.

The assignee has, for some years now, been manufacturing an apparatus for punching a plurality of exposed films having co-operating image areas to obtain punch registration, which is disclosed in the specification of its U.K. Pat. No. 2059627B and which comprises a stationary support having a platform for supporting the films to be registered and punched, a plurality of punches mounted to said support so as to be capable of punching each film outside its useable image area, two projection units supported by said support and having portions which extend over the platform, the projection units each comprising a projection screen, an optical means for magnifying an image of a respective area of film when such film is supported on the platform and a projection means for projecting the respective magnified image onto the respective projection screen, and means such as a cushion of air for enabling each of said projection units to be moved independently of the other projection unit with respect to said platform and said punches.

In use of the apparatus with exposed films having co-operating image areas, a first one of the exposed films is located in a position in which it can be punched outside its useable image area, and is punched in its located position, the two projection units are moved independently with respect to the located film and into positions in which two magnified images of portions of the image area, or of register markings on film are projected onto the two screens respectively, a second one of the exposed films is placed on the first film, the second film is moved with respect to the first film until two magnified images of co-operating portions of the image area or of the register markings of the second film are aligned on the screens with the two magnified images or register markings respectively of the first film, to obtain registration of the co-operating image areas of the first and second films, and the second film is punched outside its useable image area, and then removed and the method repeated for any remaining films.

By so projecting the film areas, parallax is eliminated, the operator can see two datum positions at once, operator fatigue is reduced, greater accuracy is achieved due to greater enlargement and speed is increased since one area of the film can be held whilst the second area of film is aligned.

Whilst the optical film punch registration in U.K. Pat. No. 2059627 is suitable for many applications, the optical projection unit assembly is bulky, needs high power illumination in view of the long optical paths and an air pump which is noisy to produce the cushions of air. Moreover, optimum registration of the optical images can still take time and be difficult to achieve, in particular in an industry working with negative film separations as opposed to positive film separations, and because there is a momentary time interval between image registration and punching.

To produce positive film separations from the negatives could be an answer but the expense would be prohibitive and would be against the established modus operandi.

SUMMARY OF THE INVENTION

A primary object of the present invention is to provide an improved apparatus and method for registering exposed films having co-operating iamge areas, such as a set of colour separations.

To this end, the present invention consists in apparatus for registering exposed films having co-operating image areas, comprising electronic means for producing one or more, preferably magnified, images of areas of each film.

By means of the invention, not only is the apparatus more compact and more easy to operate with greater accuracy but it is also has greater versatility.

Another disadvantage of the known apparatus is that the operator has to hold the second separation in the register position against the first (key) separation unless recourse is had to use of weights to enable checking of register of other areas of film prior to punching. But in either event the second separation can inadvertently be moved by the operator or there can be film distortion which decreases accuracy of register. Preferably, therefore the apparatus is provided with means for clamping the second separation in an in-register position relative to the key separation.

In order to permit a much more accurate and widespread use of such apparatus than has been hitherto been possible to achieve in particular the use of negative film separations, the apparatus is advantageously provided with image inversion means for converting the viewed images from positive to negative and negative to positive as the case may be.

Preferably, the electronic image producing means comprises two video cameras, conveniently CCD (charged coupled devices) video cameras which are independently movable over the film, and two visual display units for observing the magnified images on respective screens.

In one way of operating apparatus constructed in accordance with the invention, the two cameras are positioned over the first film which is located and which is held in the punched position to display two areas of image detail or register markings, on the respective VDU or monitor screens. Then, the second film is positioned over the first film until the images superimpose to provide a matching or pattern which corresponds to optimum register at which time the punch can be operated to punch the second film which is removed to give way to the third film and the process is repeated with the third film and each succeeding film, always leaving the key film in position.

In another embodiment of the invention, means are provided for storing respective images of the first film in a memory, the first film is removed and the second film placed under the camera to provide two real-time second images, the stored images are inverted and are added to the real-time images such that when the real-time and stored images reach a position of optimum register, the respective images will cancel each other out and the monitor screen will fade out, i.e. go white or black or grey all over.

Advantageously, means may be provided automatically to clamp and punch the second film immediately fade out occurs and before the operator can cause any unwanted movement of the second film, thereby providing even greater accuracy of punch registration.

The present invention also consists in methods of effecting film punch registration using image inversion and/or fade out.

BRIEF DESCRIPTION OF THE DRAWINGS

In order that the invention may be more readily understood, an embodiment thereof will now be described, by way of example, with reference to the accompanying drawings, in which:

FIG. 1 is a diagrammatic plan view of an apparatus for punching exposed films having co-operating image areas to obtain punch registration and in the form of a film register punch constructed in accordance with the invention, FIG. 2 is a diagrammatic front elevation of the punch of FIG. 1, FIG. 3 is a diagrammatic side elevation of the film punch of FIG. 1, FIG. 4 is a scrap view, partly in section, showing one of a plurality of punching heads and parts of the punch operating mechanism of the punch.

DETAILED DESCRIPTION OF THE PREFERRED EMBODIMENTS

Figure 5:
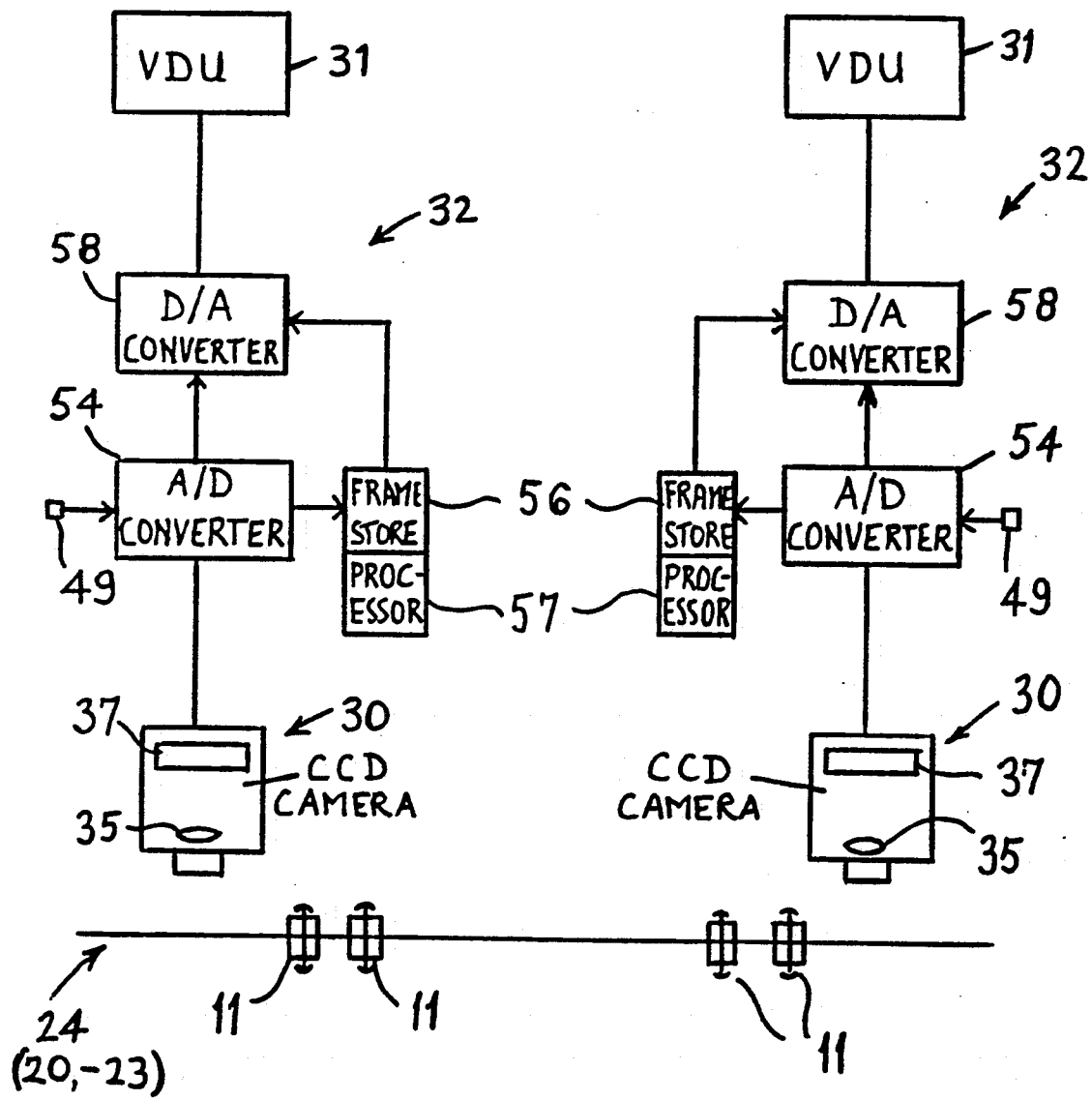
FIG. 5 is a block diagram of the electronic control circuit for the punch of FIG. 1.

Referring to FIGS. 1 to 6 of the drawings, the electronic film punch 1 comprises a frame 2 having a base member 3, front and rear support members 4, supporting a fixed platform 5 having an illuminated area 6 of transparent material, e.g. of glass, removable front, rear and side panels 7, 7a and 7b and a punching mechanism 8 comprising a number of inverted punching heads of which one punching head is shown in FIG. 4. The punching heads are electrically, mechanically or pneumatically operated by means of a foot pedal 9 which permits the operator to have both hands free for registration, and which is operative to rotate a shaft 10 by means of a lever system which is not fully shown. As shown in FIG. 4, each punching head comprises a punch 11 connected to the shaft 10, which when moved in an anti-clockwise direction as viewed in FIG. 4 the punching heads will be moved and each punch 11 will lift inside a stripper plate 12 and into a respective die block 13 to perforate film (not shown) supported on the surface of the area 6 and projecting into the gap between the stripper plate and die block with its top edge abutting against locating backstop pins 14 which are fixed to a bar 15 and which during punching are engaged in holes 16a in the stripper plate 12. A receptacle 16 is mounted on the die block 13 in communication with the punch aperture 17 therein, to receive stacks of chips punched from the films.

A backstop knob 61 is turnable to rotate shaft 15 and lift the backstop pins 14 clear of their recesses 16a, causing a cam 62 attached to the shaft 15 to actuate a microswitch 63 which energizes a solenoid (not shown) acting on the shaft 10 to lower the punches 11 into an intermediate (film hold) position within the thickness of the film to hold it in position. A foot pedal 18 energizes solenoid clamping means 64,65 66 to clamp a second separation against the first separation.

Figure 6:
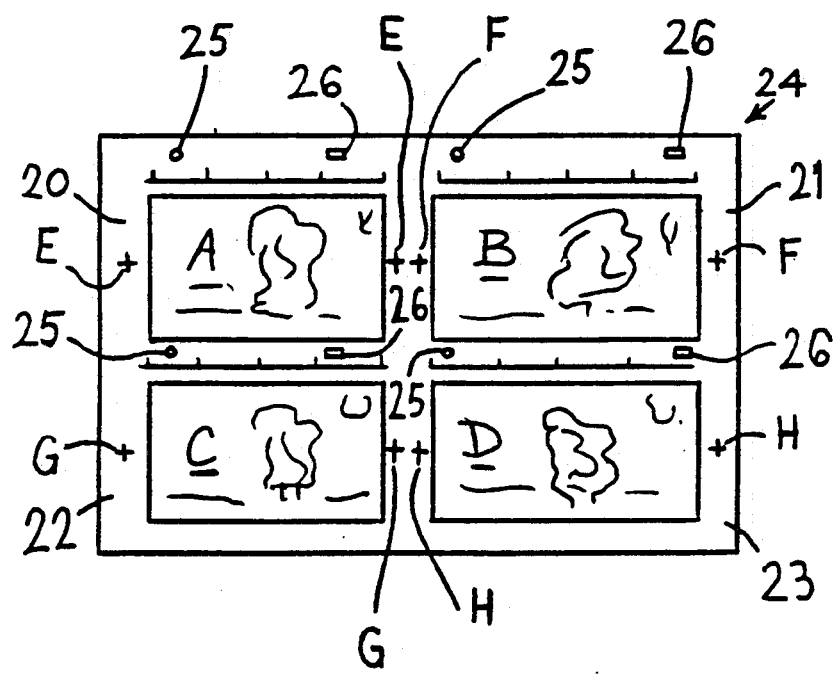
FIG. 6 is a diagrammatic representation of a sheet of film comprising four colour illustrations and produced on a multi-channel electronic scanner.

In order to register the films, e.g. four colour separations 20, 21, 22 and 23 (cyan, magenta, yellow and black), cut from the film 24 shown in FIG. 6, the film punch is provided with electronic means for producing two magnified images of portions of image areas A,B, C,D, or of register marks E,F,G,H In the illustrated embodiment, the punching mechanism 8 comprises two punching heads having punches11 which produce a round hole 25 and a slotted hole 26 in inregister positions in the colour separations, 20–23 and outside the useable image area.

The electronic image producing means comprises two independently movable left and right CCD video cameras 30, two visual display units (VDU's) or monitors 31, one for each camera 30 and having respective screens 19 and electronic control circuitry having a circuit 32, for each video camera 30 and monitor 31 as shown in FIG. 5. The electronic control circuitry is accommodated within a control housing 33 supported on a shelf 34 fixed to the frame members 4.

The video cameras 30 each comprise a respective lens 35 (FIG. 5) with a manual zoom control 36 for magnification from X10 to X27 and a respective CCD array 37. As the mountings for each video camera are identical, only one such mounting will be described for simplicity of description. The video camera 30 is mounted at the free end of a support arm 38 by means of a knuckle joint which is diagramatically illustrated at 38a in FIGS. 1 and 2 and which permits swivelling movement of the camera 30 with respect to the arm 38 about a vertical axis. The joint 38a permits a range of movement of around 90°, + and − 45% on either side of the joint axis to enable the camera lens to be maintained at an angle of substantially 90° to the punch line of the punching mechanism 8 so that the screen pattern of the image on the monitor screen 19 does not vary when the camera 30 is moved over the illuminated area 6 in a manner to be described.

The arm 38 being telescopically mounted in a hollow support arm member 39 by means of suitable runners such as 40, enables the camera 30 to be movable outwardly (extensible) and inwardly (retractable) with respect to the support arm 39. The support arm 39 is in turn fixed to a vertical shaft 41 mounted in suitable bearings and supported in a support plate 42 fixed to the upper surface of the platform 5 along its rear end, with the shaft extending through the plate 42 and platform 5 as shown in FIG. 2. Thus by means of the shaft 41 the camera 30, can be moved with respect to the platform about a vertical axis through a subtended angle of around 90°. The two shafts 41 are inside a protective housing 43 which is removably fixed to the plate 42. The combination of movements of the arms 38 and 39 enable the camera 30 to move over sufficient of the illuminated area 6 to secure satisfactory cover of the particular film separation for image production on the monitor screen 19.

In order to preserve the optimum camera position for image production, the movements of the camera 30 and its arms 38 and 39 are preferably against frictional resistance provided by any appropriate means. Thus when the movement of the camera 30 has been stopped in a final position then the camera will stay in that position, unless accidently knocked. It is possible, of course, to actuate an appropriate means (not shown) to positively lock or otherwise hold the camera in its final position if so required.

The monitors 31 are mounted in a housing 44, having a console panel 45, which is supported from a pedestal 46 fixed to the platform 5 at a location between the shaft housing 41 and punching mechanism 8. The console panel 45 has two monitor brightness controls 47, one for each monitor and LED 48 which is switched on when the film hold solenoid is energised, preferably another LED (not shown) which switches on when pedal 18 is pressed and a positive/negative change over push button switch 49 for reversal of the film image on the monitor screens 19. The illuminated area 6 is of translucent glass which is flush fitted in sealed relationship with the surrounding platform 5. The illumination is provided from a light box 50 secured to the under surface of the platform 5 and having a lamp on/off switch 51.

A power on/off switch 52 is provided on the right hand, as illustrated, side panel 7b, together with a warning lamp 53.

Referring more particularly to FIG. 5, as each camera 30 has an identical control circuit 32, one will now be described. The camera CCD array 37 is connected to the monochrome monitor 31 through an analogue to digital converter 54 which digitizes, frame stores and manipulates the image, i.e. provides for inversion of the screened image on both the monitors, by operating the single push button switch 49 on the console panel 45. In order to provide for storage of the image in the frame memory with the key film removed, each circuit 32 includes a frame store (memory) 56 and processor 57 which takes video data from the camera 30, converted to digital form by the analogue to digital converter 54. Conveniently, the frame store and processor are mounted on a card mounted in the housing 33 with all the components of the control circuitry. Once the image is stored in the memory of the frame store 56, various software algorithms i.e. image summation, edge enhancement, positive/negative inversion can be applied to the frame store 56 by the processor 57. When the real-time images of a second film are screened by the monitor 31, the stored images of the first film are inverted by the processor 57 when the switch 49 is operated and are digitally added to the stored video images in the frame store 56 by the digital to analogue converters 58.

This process cancels the real-time and stored video images when an exact match occurs whereby the images on the two monitor screens fade out all over, i.e. become white, black or grey. This contributes a very simple, yet powerful, visual method of image registration since the operator no longer has to decide as to when the images on the second film are in register with these of the key first film. Owing to the screen angle effect, the two images will never cancel to 100%, but a threshold can be applied to the summed data in the processors 57 so that registration is defined to be above a preset value, above which the screens will fade out automatically register is attained.

In one embodiment and as an option, the punching mechanism 8 could be servo-activated to automatically clamp and punch the second separation when both left and right images exceed the set threshold and before the operator can inadvertently move the separation.

In a first method of operation involving manual image registration, the colour separation with the most image detail (usually the cyan 20) is placed on the illuminated area 6, to act as a key centred (located) to the punches 11 with a suitable back-stop setting of the back stop pins 14 (3 or 12 mm), and punched using the right hand foot pedal 9. Whilst the punch pedal 9 is depressed the backstop knob 61 is turned to rotate shaft 15 and lift the backstop pins 14 clear of their recesses 16a. This action causes a cam 62 attached to the shaft 15 to actuate a microswitch 63 which energizes a solenoid (not shown) acting on the shaft 10 to lower the punches 11 into their intermediate positions within the thickness of the key separation 20 to hold it in position.

The two cameras 30 are manually positioned over the key separation 20 and two areas of image detail (e.g. areas of reasonable contrast change) are selected and displayed on the screens 19 of left and right monitors 31. The cameras are initially set to 10X magnification.

Next, the second separation is placed over the first, and manipulated until the images exactly superimpose on the left and right hand monitors (an optional 30X zoom can be used if fine detail is required). As the separations have different screen angles, the image matching is never exact, but a rosette pattern appears when optimum register is attained. When the separation is aligned at optimum register the foot pedal 18 is operated which energizes the two solenoids 64 (only one shown in FIG. 4) each having an actuating rod 65 with a rubber foot 66 extending between the punching heads to move downwards and so that the feet 66 clamp the second separation against the first separation and hold it securely in the register position. This action leaves the operator's hands completely free and enables the operator to move the cameras 30 over selected other areas of the film to check on the monitors whether those areas are in register. This is of particular value as it enables accurate registration of selected film areas which, in particular printing fields, are of more importance than others. When the operator is satisfied, the foot pedal 9 is operated to punch the films, the foot pedal 18 is released to de-energize the solenoids 64 to retract the clamping feet 66, and the second separation is removed.

This is repeated for the third and fourth separations, each time leaving the first separation in the punch as the key. After all the separations have been punched, the knob 61 is turned in the opposite direction to move the backstop pins 14 into their recesses 16a and de-energizes the solenoid for the shaft 10 to lower the punches 11 out of their film hold intermediate position. In a second method, for negative film separations, where the image is predominantly black and hence difficult to register by eye, negative to positive inversion using analogue to digital conversion is used thereby enabling negative separations to be viewed, and registered, as positives which is a much easier and far more accurate process.

In a third method of operation using the frame store and semi-automatic registration with fade-out, the key separation is punched as usual, two areas of the image are selected and the camera arms held or locked in position. The two images are then stored in the frame memory and the key separation is removed. The second separation is placed under the cameras and the stored pictures inverted by operating switch 49 and digitally added to the real-time second images. This process cancels the real-time and stored video images when an exact match is found, whereby the two monitor screens become white all over, i.e. fade out.

In a fourth method of operation which provides automatic film registration, this involves the use of an X, Y servo driven punch platform (not shown), moving under the two film cameras 30.

The four colour separations 20 to 23 would be trimmed to the same size, with standard cutters, using an illuminated film cutter with scribed reference lines and/or jig plates to roughly position the image area to the film boundary (say by ±0.5 mm).

The four separations would be loaded into a cassette mechanism, set at the outer dimension of the cut film sets, and the cassette loaded into the auto punching system. The first separation (the key colour) would be automatically loaded onto the servo X, Y table, positioned centrally under the punches 11 to backstops 14 and punched. The two cameras, either servo or manually operated, would be positioned over the two target image areas, the cameras locked in position, and the left and right hand images stored.

Next, the first separation would be automatically ejected, the second separation brought under the punches and centred. As the film has been cut to present the images in rough pre-alignment, the images under the camera will have only a positional uncertainty relative to the stored image of about ±0.5 mm. This pre-alignment limits the area of search for image matching, making the software algorithms simpler and quicker. The servo table would move the film in X and Y (and rotation) and the real-time video images (left and right) inverted and summed with the frame stored images until a match had been found (using threshold levels, as above, for correcting for screen angle misalignments). When both images are aligned the film is automatically punched.

The above sequence is repeated for the third and fourth separations, the sets returned to the cassette, which is ejected to complete the cycle.

It should be appreciated that the invention is not limited to the embodiments herein described but includes all modifications and variations falling within its scope. For example, the cameras 30 could be mounted for movement in any other appropriate manner than that described. Furthermore, instead of using a self-holding friction means to hold the cameras in the in-register position, the cameras may be positively held, clamped or locked in these positions by any suitable means. Whilst in the illustrated embodiment, the platform 5 has rearward extensions 60 which protect the camera mountings from damage when the platform is pushed up against a wall, for example, these extensions could be replaced by, for example extending the whole platform rearwards beyond the arms 39.

In another modification, the punches 11 could be electrically operated, e.g. by a solenoid.

I claim:

1. Apparatus for registering exposed films having cooperating image areas, comprising in combination:
   (a) platform means for supporting said films to be registered,
   (b) punch means cooperating with said platform means and adapted to punch registration holes in a first one of said films disposed on said platform means at locations outside an image area of said first film, and
   (c) electronic means for producing an image of at least one selected part of said first film, said electronic means including:
      (1) at least one imaging means for producing video signals representing said image of said at least one selected part of said first film,
      (ii) means mounting said imaging means for movement with respect to said platform means for positioning said imaging means opposite said at least one selected part of said first film for viewing said part,
      (iii) at least one video display unit for displaying said image, and
      (iv) means connecting said imaging means to said visual display unit for transmitting said video signals to said visual display unit for display of said image.

2. The apparatus claimed in claim 1, further comprising back-stop means cooperating with said platform means for locating a rear edge of said first film disposed on said platform means, and means operable selectively to move said back-stop means into and out of the film locating position thereof.

3. The apparatus claimed in claim 1, wherein said platform means has means defining an illuminated area for illuminating said first film supported on said platform means.

4. The apparatus claimed in claim 1, further comprising means for clamping a second one of said films supported on said platform means in a desired position on said platform means.

5. The apparatus claimed in claim 4, wherein said connecting means includes means for detecting film registration, and means responsive to said detecting means to actuate said clamping means.

6. The apparatus claimed in claim 1, wherein said connecting means includes means for detecting film registration, and means responsive to said detecting means to actuate said punch means.

7. The apparatus claimed in claim 1, wherein said connecting means includes image inversion means selectively operable to process said video signals and convert said image from negative to positive and from positive to negative, as the case may be.

8. The apparatus claimed in claim 1, wherein said connecting means includes analog-to-digital converting means for converting analog video signals produced by said imaging means into digital video signals for further processing.

9. The apparatus claimed in claim 1, wherein said connecting means includes memory means for storing said video signals representing said image of said at least one selected part of said first one of said films disposed on said platform means for subsequent comparison with video signals representing an image of at least one part of a second one of said films disposed on said platform means, whereby to provide for registration of said second film with said first film.

10. The apparatus claimed in claim 9, wherein said connecting means includes means for comparing said stored video signals derived from said first film with said video signals derived from said second film and producing a resulting display on said at least one visual display unit, whereby the position of said second film can be adjusted to register cooperating image areas of said first and second films.

11. The apparatus claimed in claim 9, wherein said connecting means includes means for comparing said stored video signals derived from said first film with said video signals derived from said second film, said latter video signals representing a real time image, whereby the position of said second film can be adjusted to register cooperating image areas of said first and second films.

12. The apparatus claimed in claim 11, wherein said connecting means includes image inversion means selectively operable to invert said stored video signals, and means is provided for algebraically adding said stored video signals to said video signals derived from said second film and representing said real time image, whereby optimum registration results in cancellation of said signals and substantial image fade out on said at least one visual display unit.

13. The apparatus claimed in claim 1, wherein said platform means is movable with respect to said at least one imaging means under control of servo means in the X and Y directions and in rotation, and further comprising means for operating said servo means under control of a signal derived from comparing means so as to position said second film in a position in which cooperating image areas of said first and second films are in register.

14. The apparatus claimed in claim 1, wherein said mounting means for said at least one imaging means comprises arm means adjustable to permit said at least one imaging means a predetermined range of movement with respect to said platform means, and means is provided for retaining said arm means in an adjusted position thereof.

15. Apparatus for registering exposed films having cooperating image areas comprising in combination:
(a) platform means for supporting said films to be registered,
(b) punch means cooperating with said platform means and adapted to punch registration holes in a first one of said films disposed on said platform means at locations outside an image area of said first film, and
(c) electronic means for producing magnified images of at least two different selected parts of said first film, said electronic means including:
    (i) at least two imaging means for producing video signals representing said magnified images,
    (ii) means mounting each of said imaging means for independent movement with respect to said platform means for positioning said imaging means opposite said selected parts of said first film for viewing said parts,
    (iii) at least two video display units for displaying respective ones of said magnified images, and
    (iv) means connecting said at least two imaging means to said at least two visual display units for transmitting said video signals to said visual display units for display of said magnified images.

16. The apparatus claimed in claim 15, wherein said at least two imaging means comprise video cameras and said connecting means comprises electronic control means connecting said video cameras to said at least two visual display units, respectively.

17. The apparatus claimed in claim 16, wherein said video cameras include means for varying the magnification of said magnified images.

18. The apparatus claimed in claim 15, wherein said at least two imaging means are mounted respectively on at least two arm means which are adjustable so as to permit said imaging means a predetermined range of movement with respect to said platform means.

19. The apparatus claimed in claim 18, wherein each of said arm means comprises a multi-part arm, the parts of which are connected together for relative movement.

20. The apparatus claimed in claim 18, wherein each of said arm means is pivotally mounted for movement about an axis substantially perpendicular to said platform means, and said imaging means are mounted on said arm means for swivelling movement about axes substantially perpendicular to said platform means.

21. The apparatus claimed in claim 19, wherein said parts of each arm are connected together so as to be telescopically adjustable relatively to one another.

22. The apparatus claimed in claim 18, further comprising means for retaining said at least two arm means in adjusted positions thereof.

23. The apparatus claimed in claim 19, further comprising frictional resistance means for resisting relative movement of said parts of said arm means for retaining said arm means in adjusted positions thereof.

24. The apparatus claimed in claim 15, wherein said at least two visual display units are mounted side-by-side at positions which are disposed above said at least two imaging means in relation to said platform means.

25. The apparatus claimed in claim 16, further comprising arm means respectively mounting said video cameras, said arm means being adjustable so as to permit said video cameras a predetermined range of movement with respect to said platform means, means for retaining said arm means in adjusted positions thereof, and means defining an illuminated area in said platform means for illuminating a film supported by said platform means, said electronic control means including image inversion means selectively operable to process said video signals and convert said magnified images from negative to positive and from positive to negative, as the case may be, and memory means for storing said video signals representing said magnified images derived from said first one of said films disposed on said platform means for subsequent comparison with video signals representing magnified images derived from a second one of said films disposed on said platform means, whereby to provide for registration of said second film with said first film.

26. A method of registering exposed films having cooperating image areas, comprising the steps of:
   (a) disposing a first film on platform means having punch means for punching registration holes in film,
   (b) utilising said punch means to punch registration holes in said first film outside said image area thereof,
   (c) electronically producing video signals representing an image of at least one selected part of said first film,
   (d) disposing a second film on said platform means and electronically producing video signals representing an image of at least one part of said second film,
   (e) comparing said video signals derived from said first and second films,
   (f) adjusting said second film until said comparing step indicates that said at least one selected part of said first film is in register with a cooperating part of said second film, and
   (g) thereupon punching registration holes in said second film outside said image area thereof.

27. The method claimed in claim 26, wherein said video signals representing said images are analog signals and said analog signals are converted into digital signals for use in said comparing step.

28. The method claimed in claim 26, further comprising the step of storing said video signals representing said image of said at least one selected part of said first film, and wherein said comparing step comprises comparing said stored video signals with video signals representing said image of said at least one part of said second film, said image derived from said second film being a real time image.

29. The method claimed in claim 26, wherein said comparing step includes the step of inverting said video signals derived from at least one of said films so as to convert said image derived from said at least one film from negative to positive and from positive to negative, as the case may be.

30. The method claimed in claim 29, wherein said comparing step further includes utilising at least one visual display unit, inverting one of said video signals, and algebraically adding said inverted video signals and the other non-inverted video signals such that in a position of optimum registration substantial image fade out occurs on said visual display unit.

* * * * *